US011056458B2

(12) United States Patent
Kessler et al.

(10) Patent No.: US 11,056,458 B2
(45) Date of Patent: Jul. 6, 2021

(54) PACKAGE COMPRISING CHIP CONTACT ELEMENT OF TWO DIFFERENT ELECTRICALLY CONDUCTIVE MATERIALS

(71) Applicant: Infineon Technologies AG, Neubiberg (DE)

(72) Inventors: Angela Kessler, Sinzing (DE); Andreas Grassmann, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/690,948

(22) Filed: Nov. 21, 2019

(65) Prior Publication Data

US 2020/0176412 A1 Jun. 4, 2020

(30) Foreign Application Priority Data

Nov. 29, 2018 (DE) ................... 10 2018 130 292.4
Nov. 14, 2019 (DE) ................... 10 2019 130 778.3

(51) Int. Cl.
*H01L 21/56* (2006.01)
*H01L 23/00* (2006.01)

(52) U.S. Cl.
CPC ............. *H01L 24/73* (2013.01); *H01L 21/56* (2013.01); *H01L 24/05* (2013.01); *H01L 24/11* (2013.01); *H01L 24/13* (2013.01); *H01L 24/43* (2013.01); *H01L 24/45* (2013.01); *H01L 24/48* (2013.01); *H01L 2224/05624* (2013.01); *H01L 2224/13082* (2013.01); *H01L 2224/13124* (2013.01); *H01L 2224/13147* (2013.01); *H01L 2224/45032* (2013.01); *H01L 2224/45124* (2013.01); *H01L 2224/45147* (2013.01); (Continued)

(58) Field of Classification Search
CPC ....................................................... H01L 24/73
See application file for complete search history.

(56) References Cited

U.S. PATENT DOCUMENTS 7,709,938 B2   5/2010  Laska et al.
7,745,253 B2   6/2010  Luechinger
(Continued)

FOREIGN PATENT DOCUMENTS

DE   10 2004 030 042   1/2006
DE   10 2005 028 951   12/2006
(Continued)

*Primary Examiner* — William A Harriston
(74) *Attorney, Agent, or Firm* — Dicke, Billig & Czaja, PLLC

(57) ABSTRACT

A package and method of making a package is disclosed. In one example, the package includes an electronic chip having at least one pad, an encapsulant at least partially encapsulating the electronic chip, and an electrically conductive contact element extending from the at least one pad and through the encapsulant so as to be exposed with respect to the encapsulant. The electrically conductive contact element comprises a first contact structure made of a first electrically conductive material on the at least one pad and comprises a second contact structure made of a second electrically conductive material and being exposed with respect to the encapsulant. At least one of the at least one pad has at least a surface portion which comprises or is made of the first electrically conductive material.

26 Claims, 4 Drawing Sheets

(52) U.S. Cl.
CPC ............... *H01L 2224/73205* (2013.01); *H01L 2224/73207* (2013.01); *H01L 2224/73209* (2013.01)

(56) References Cited

U.S. PATENT DOCUMENTS

| | | |
|---|---|---|
| 7,799,614 B2 | 9/2010 | Otremba et al. |
| 8,044,523 B2 | 10/2011 | Otremba |
| 8,309,434 B2 | 11/2012 | Asai et al. |
| 9,490,192 B1* | 11/2016 | Chen .................... H01L 21/486 |
| 2004/0266037 A1 | 12/2004 | Knapp et al. |
| 2010/0078783 A1* | 4/2010 | Otremba ............... H01L 25/115 |
| | | 257/676 |
| 2010/0133577 A1 | 6/2010 | Hoffmann et al. |
| 2017/0278762 A1 | 9/2017 | Kessler et al. |

FOREIGN PATENT DOCUMENTS

| | | |
|---|---|---|
| DE | 10 2008 062 498 | 7/2007 |
| DE | 10 2007 025 950 | 1/2008 |
| DE | 10 2007 035 902 | 2/2009 |
| DE | 10 2015 205 704 | 10/2016 |
| DE | 10 2016 105 581 | 9/2017 |
| DE | 1 2004 000 727 | 4/2018 |
| EP | 2 677 541 | 12/2013 |

* cited by examiner

PACKAGE COMPRISING CHIP CONTACT ELEMENT OF TWO DIFFERENT ELECTRICALLY CONDUCTIVE MATERIALS

CROSS-REFERENCE TO RELATED APPLICATIONS

This Utility Patent Application claims priority to German Patent Application No. 10 2018 130 292.4, filed Nov. 29, 2018, and German Patent Application No. 10 2019 130 778.3, filed Nov. 14, 2019, both of which are incorporated herein by reference.

BACKGROUND

The present invention relates to packages and a method of manufacturing a package.

Packages may be denoted as encapsulated electronic chips with electrical connects extending out of the encapsulant and being mounted to an electronic periphery, for instance on a printed circuit board.

Packaging cost is an important driver for the industry. Related with this are performance, dimensions and reliability. The different packaging solutions are manifold and have to address the needs of the application.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DETAILED DESCRIPTION OF EXEMPLARY EMBODIMENTS

Figure 1:
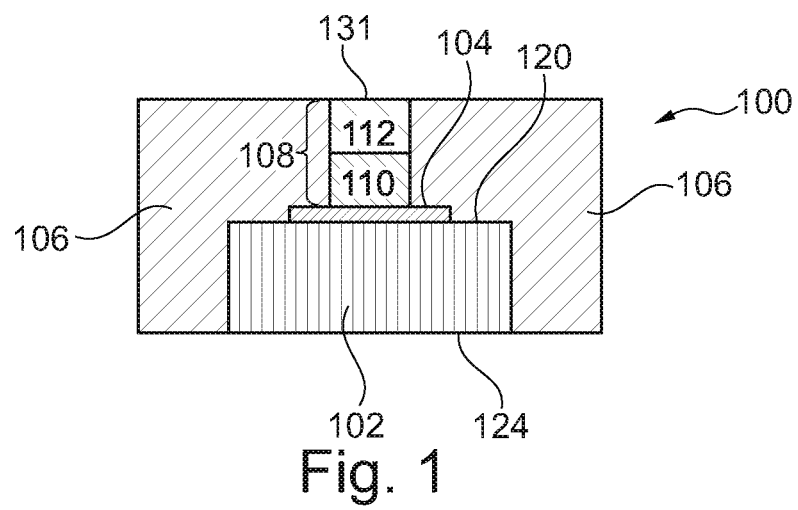
FIG. 1 illustrates a cross-sectional view of a package according to an exemplary embodiment.

There may be a need to manufacture a package in a simple and reliable manner.

According to an exemplary embodiment, a package is provided which comprises an electronic chip having at least one pad, an encapsulant at least partially encapsulating the electronic chip, and an electrically conductive contact element extending from the at least one pad and through the encapsulant so as to be exposed with respect to the encapsulant, wherein the electrically conductive contact element comprises a first contact structure made of a first electrically conductive material on the at least one pad and comprises a second contact structure made of a second electrically conductive material and being exposed with respect to the encapsulant. At least one of the at least one pad has at least a surface portion which comprises or is made of the first electrically conductive material.

According to another exemplary embodiment, a package is provided which comprises an at least partially electrically conductive chip carrier, an electronic chip mounted on the chip carrier, wherein the electronic chip is provided with a pad having an exterior surface comprising a first metal, an electrically conductive contact element extending from the pad, and an encapsulant at least partially encapsulating the contact element and the electronic chip, wherein the contact element comprises a first contact structure on the at least one pad and comprising the first metal and comprises a second contact structure having an exposed surface being not covered by the encapsulant and comprising a second metal.

According to yet another exemplary embodiment, a method of manufacturing a package is provided, wherein the method comprises at least partially encapsulating an electronic chip having at least one pad by an encapsulant, providing an electrically conductive contact element extending from the at least one pad and through the encapsulant so as to be exposed with respect to the encapsulant, and configuring the electrically conductive contact element to comprise a first contact structure made of a first electrically conductive material on the at least one pad and to comprise a second contact structure made of a second electrically conductive material and being exposed with respect to the encapsulant. At least one of the at least one pad has at least a surface portion which comprises or is made of the first electrically conductive material.

According to an exemplary embodiment, a package and a manufacturing method for manufacturing such a package may be provided, wherein an electrically conductive contact element has a first surface directly contacting a chip pad and has another second surface being exposed with regard to an encapsulant for allowing electrically contacting the encapsulated chip from an exterior of the encapsulated package. A first contact structure of the contact element contacting the chip pad is made of another electrically conductive material than the exposed portion of the contact element, i.e. the second contact structure. Thereby, it is possible to contact the chip pad for instance with the same electrically conductive material as the chip pad and to contact the exposed portion of the second contact structure with another electrically conductive structure being preferably made of the same material as the second contact structure. Descriptively speaking, the contact element may serve as a robust electrically conductive material interface.

For instance, a bimetallic or multimetallic integrally formed contact element may be provided allowing in a simple and efficient way the provision of an electric connection for an encapsulated chip pad without the need of establishing connections between different metals of chip pad and contact element on the one hand and of contact element and an exterior electrically conductive contact structure on the other hand. This simplifies packaging the chip and provides a simple and robust solution for chip packaging. The contact element may contact the chip pad in a mechanically robust and stable way while also the surface portion of the second contact structure extending beyond the encapsulant remains free for establishing a further electrically conductive connection between the second contact structure and the electronic periphery. In other words, the exposed portion of the second contact structure may function as a "package pad". This ensures an even more stable and reliable mechanical connection than using bond wires directly contacting the electronic chip. Connecting a bond wire to an electronic chip directly may require to apply some pressure on the sensitive semiconductor chip which causes a danger of damaging the latter. By using a bimetallic or multimetallic contact element which can lead to softer wire bonding and in general an easier connection to the chip pad, the mechanical impact on the chip may be reduced, thereby ensuring a proper protection of the chip (such as a semiconductor die) during packaging. Furthermore, connecting a bond wire foot in form of a bi- or multimetallic stack enables the usage of all kind of chip top metals, especially existing technologies with their top metallization.

According to the exemplary embodiments, at least one of the at least one pad has at least a surface portion which is made of the first electrically conductive material. Thus, an undesired additional material bridge between the pad and the contact element may be prevented by the contact element.

In the following, further exemplary embodiments of the packages and the method will be explained.

In the context of the present application, the term "package" may particularly denote at least one at least partially encapsulated electronic chip with at least one external electric contact.

The term "electronic chip" may particularly denote a semiconductor chip having at least one integrated circuit element (such as a diode or a transistor) in a surface portion thereof. The electronic chip may be a naked die or may be already packaged or encapsulated.

In the context of the present application, the term "encapsulant" may particularly denote a substantially electrically insulating and preferably thermally conductive material surrounding (for example hermetically surrounding) an electronic chip and optionally part of a carrier to provide mechanical protection, electrical insulation, and optionally a contribution to heat removal during operation. Such an encapsulant can be, for example, a mold compound. When encapsulating by molding, injection molding or transfer molding may be carried out, for example.

In the context of the present application, the term "chip carrier" may particularly denote an electrically conductive structure which serves as a support for the one or more chips, and which may also contribute to the electric interconnection between the chip(s) and the periphery. In other words, the carrier may fulfil a mechanical support function and an electric connection function.

In the context of the present application, the term "contact element" may particularly denote an integrally formed electrically conductive body comprising at least two different electrically conductive materials, one of which constituting a first contact structure and the other one constituting a second contact structure. The first contact structure and the second contact structure may have a material interface in an interior of the contact element. The first contact structure may be configured to contact a chip pad, and the second contact structure may be configured to provide an electrically conductive coupling between the first contact structure and the exposed portion of the second contact structure. The first contact structure and the second contact structure may form a double layer or a multi-layer.

In an embodiment, the first electrically conductive material may be for instance a pure metal, a metal with additives, or an alloy. The at least one pad may be made in particular also from the first electrically conductive material. The second electrically conductive material may be different from the first electrically conductive material, and may be, for example, a pure metal, a metal with additives, or an alloy. The second metal may be different from the first metal.

In an embodiment, the contact element or bond foot may be a bimetallic or multi-metallic structure, which may allow obtaining a softer bond parameter. It is also possible to use a bimetallic or multi-metallic contact element for mounting (in particular soldering) a further component on the chip.

In an embodiment, the first contact structure may be a first layer formed only of the first metal or first electrically conductive material. Correspondingly, the second contact structure may be a second layer on the first layer and formed only of the second metal or second electrically conductive material. The first metal or first electrically conductive material may be made of a different material than the second metal or second electrically conductive material. As mentioned above, the package may comprise a chip carrier on which the electronic chip is mounted. For instance, such a chip carrier may comprise a leadframe and/or a ceramic sheet (or another electrically insulating body made of another material such as silicon nitride or aluminum oxide) covered on both opposing main surfaces with a respective metallic layer (in particular an Active Metal Braze (AMB) substrate and/or a Direct Copper Bonding (DCB) substrate). Thus, a proper mounting base for mounting the chip can be established.

In an embodiment, the chip carrier is at least partly electrically conductive. In such an embodiment, the chip carrier may also contribute to the electric connection of the electronic chip. For instance, a further pad on the main surface of the electronic chip facing the chip carrier may be electrically conductively coupled to the chip carrier.

In a further embodiment, the chip carrier is a leadframe. Such a leadframe may be a sheet-like metallic structure which can be patterned so as to form one or more mounting sections for mounting the one or more electronic chips of the package, and one or more lead sections for electric connection of the package to an electronic environment when the electronic chip(s) is/are mounted on the leadframe. In an embodiment, the leadframe may be a metal plate (in particular made of copper) which may be patterned, for instance by stamping or etching. Forming the chip carrier as a leadframe is a cost-efficient and mechanically as well as electrically advantageous configuration in which a low ohmic connection of the at least one electronic chip can be combined with a robust support capability of the leadframe. Furthermore, a leadframe may contribute to the thermal conductivity of the package and may remove heat generated during operation of the electronic chip(s) as a result of the high thermal conductivity of the metallic (in particular copper) material of the leadframe. A leadframe may comprise for instance aluminum and/or copper.

In an embodiment, the chip carrier has at least a surface portion which comprises or is made of a third electrically conductive material (for instance an alloy comprising copper), wherein the third electrically conductive material in particular comprises or is made of the second electrically conductive material (for instance copper). In such an embodiment, the electrically conductive surface of the chip carrier may be used for establishing an electric connection to the one or more semiconductor chips. When the chip carrier has also an electrically insulating portion, this can contribute to a proper electric isolation of the electronic chip with regard to an electronic periphery.

In an embodiment, the chip carrier is connected with at least one further pad of the electronic chip, wherein the at least one pad is formed on one main surface of the electronic chip and the at least one further pad is formed on an opposing other main surface of the electronic chip. Some electronic chips have pads on both opposing main surfaces thereof. An example is an electronic chip with vertical current flow. For instance, a transistor chip may have a source pad and a gate pad on one main surface and a drain pad on the other opposing main surface. In such an embodiment, one or more contact elements may be used for contacting a first part of the pads of the electronic chip, whereas the electrically conductive chip carrier may be used for contacting at least one other part of the pads of the electronic chip.

In an embodiment, the package comprises at least one electrically conductive protrusion protruding from the chip carrier, in particular up to a vertical level up to which the contact element extends. For instance, such an electrically conductive protrusion may be a block, post or pillar, for instance made of copper, providing for a vertical connection between the electrically conductive chip carrier and the upper main surface of the chip via the contact element. The electrically conductive protrusion may extend up to the same level as the contact element. This then allows a connection between the contact element and the protrusion by a planar structure such as a redistribution layer (RDL).

In an embodiment, the at least one electrically conductive protrusion extends through the encapsulant so as to be exposed with respect to the encapsulant. In such an embodiment, the electrically conductive protrusion may be reliably mechanically connected and electrically isolated by the same encapsulant which is also used for encapsulating the chip and part of the contact element. The result is a compact and reliable package.

In an embodiment, the at least one electrically conductive protrusion comprises or is made of a fourth electrically conductive material, wherein the fourth electrically conductive material in particular comprises or is made of one of the second electrically conductive material and the third electrically conductive material. When the electrically conductive protrusion is made of the second and/or third electrically conductive material from which also the second contact structure of the contact element and/or the carrier is made, a (for instance horizontal) connection between the electrically conductive protrusion and the contact element extending out of the encapsulant may be established without a further material bridge. Also a connection with the carrier can then be established in a simple way.

In an embodiment, the method comprises mounting the electronic chip on a chip carrier. It is furthermore possible to attach an electrically conductive protrusion to the chip carrier. This may be done before encapsulating part of the protrusion. Thus, also the chip carrier and the electrically conductive protrusion may be encapsulated partially during the encapsulation procedure.

In an embodiment, the encapsulant comprises or consists of an electrically insulating material. As a result, the material of the encapsulant may contribute to electrically insulate the chip, the contact element, optionally a chip carrier and optionally an electrically conductive protrusion.

In an embodiment, the contact element is a bimetal structure, in particular an aluminum-copper bimetal structure. Such a bimetal structure, i.e. a contact element consisting of two different metallic materials with a material interface in between, is simple to manufacture and highly efficient for the purpose of providing a package according to an exemplary embodiment. For instance, such a bimetal structure may be a bimetal layer or plate. When one of the metals of the bimetal structure is aluminum, it is possible to contact aluminum pads of semiconductor chips. When the other metal of the bimetal structure is copper, a proper connection of such an aluminum pad with copper leadframes or copper pillars or posts becomes possible as well. Thus, a compact package may be obtained which is robust against damage even under harsh conditions and allows the avoidance of material bridges for establishing a contact between chip pad and an electronic environment.

In an embodiment, the package comprises an electrically conductive connection structure on a surface portion of the contact element (in particular on the second contact structure thereof), which surface portion is exposed with respect to the encapsulant. Such an electrically conductive connection structure may be made of the same material as the second contact structure being exposed with regard to the encapsulant. Then, a direct connection between the contact element and such an electrically conductive connection structure can be formed without establishing a further transition between metallic materials, which might cause problems between soldering, etc.

For instance, the electrically conductive connection structure may comprise at least one of the group consisting of a redistribution structure (in particular a redistribution layer at least partially on the encapsulant and on the contact element), a clip, a wire bond, and a ribbon bond.

A clip may be a three-dimensionally bent plate type connection element which has two planar sections to be connected to an upper main surface of the respective electronic chip and an upper main surface of the chip carrier, wherein the two mentioned planar sections are interconnected by a slanted connection section.

As an alternative to such a clip, it is possible to use a wire bond or ribbon bond which is a flexible electrically conductive wire or ribbon shaped body having one end portion connected to the upper main surface of the respective chip and having an opposing other end portion being electrically connected to the chip carrier.

A redistribution structure (in particular a redistribution layer) may be denoted as a multilayer structure of electrically conductive elements within a dielectric matrix which translates, in terms of electrically conductive connection surfaces, between a small chip size and a larger size of a further electronic member to be connected with the encapsulated chip via the redistribution structure, in particular on top thereof.

In an embodiment, the electronic chip is a transistor chip having a source pad, a drain pad and a gate pad as the at least one pad. In particular, the source pad and the gate pad may be formed on the same main surface of the electronic chip and may be each coupled with a respective contact element. The drain pad may be formed on an opposing other main surface of the electronic chip. Such a transistor chip may be a chip fulfilling the function of a transistor, in particular of a field effect transistor. In particular, a source pad and a gate pad may be formed on one main surface of such a transistor chip, whereas a gate pad may be formed on an opposing other main surface of the transistor chip. Such a transistor chip may be used for instance for semiconductor power applications.

In an embodiment, the first metal is aluminum. This allows to use the contact element for directly contacting an aluminum pad of a semiconductor chip. Conventionally, the combination of a semiconductor chip having an aluminum pad with another electrically conductive connection structure (such as a leadframe) made of copper involves problems due to the different metallic materials. These problems may be overcome by the bimetallic or multimetallic contact element used as a metal-metal-junction according to an exemplary embodiment.

In an embodiment, the second metal is copper. When the second metal is copper, a subsequent connection of the exposed portion of the contact element with an electric periphery is simplified, which in many cases is formed based on copper. This holds for copper leadframes, printed circuit boards with copper structures, copper pillars as electrically conductive protrusions. Also wire bonds, clips and ribbon bonds are in many cases made of copper.

In an embodiment, a thickness of the first contact structure is different from, in particular is smaller than, a thickness of the second contact structure. The first contact structure may be a layer made of the first metal. The second contact structure may be a layer being interconnected with the first contact layer and made of the second metal. Such a multi-layer bimetallic or multimetallic contact element is compact and robust as well as simple and cheap in manufacture. Furthermore, such a double layer contact element allows to use the individual thicknesses of the individual layers of the integral contact element as a design parameter for adjusting the desired properties of the contact element. For instance, the first contact structure being connected to the chip pad may have the function of forming an electrically connection of the chip pad without a material bridge. A relative small thickness of the first contact structure is therefore in many cases sufficient. In contrast to this, the second contact structure may have the function of establishing an electric connection at the exposed surface of the contact element, in many cases a copper coupling surface. However, copper is not only cheap and appropriate in processing, but has also a very high thermal conductivity. Providing the second contact structure from a thick copper layer can therefore allow the avoidance of intermetallic connections on both opposing sides of the contact element, and may provide at the same time a thermally highly appropriate contact element.

Alternatively, the thicknesses of the first contact structure and the second contact structure may be the same.

In an embodiment, the contact element is configured as a multi-metallic stack, which may for instance comprise three or more stacked contact structures. In particular, the contact element may additionally comprise a third contact structure between the first contact structure and the second contact structure. Since the function of the first and the second metal of the contact element are to establish connections with chip pad and an electronic periphery of the package without material bridges, there is the freedom of design to sandwich at least one further third contact structure (in particular a third contact layer) between the first contact structure and the second contact structure. The material properties of the third contact structure may then be adapted in accordance with the requirements of a specific application. For instance, properties such as corrosion resistance, high electric conductivity, high thermal conductivity, etc. may be provided by the third contact structure. It is possible that a vertical dimension of the third contact structure is even larger than a vertical dimension of the first contact structure and the second contact structure, so that the physical properties of the contact element may be dominated by the third contact structure.

In particular, the third contact structure may comprise or consist of a material having a higher thermal conductivity, a higher electric conductivity and/or a lower Young modulus than at least one of the first contact structure and the second contact structure. When configuring the third contact structure of a material having a very high thermal conductivity and/or electric conductivity (for instance graphene), the thermal and/or electric performance of the package may be further improved. In another advantageous embodiment, the third contact structure may be made of a material having a low Young modulus, i.e. being very soft, so that it may serve as a stress buffer and may therefore improve reliability of the package.

In an embodiment, the contact element is plate-shaped or strip-shaped. In particular, the contact element may be a multi-layer (in particular bilayer) multimetallic (in particular bimetallic) platelet. Such a platelet may be easily formed from a larger sheet or ribbon, for instance by punching. Furthermore, the plate-shaped geometry of the contact element has the advantage that it can be contacted both with the chip pad as well as with the electronic periphery of the package in a robust way. Unlike a much more sensitive wire bond, applying a significant pressure on such a plate-like contact element can be done without the risk of damaging the contact element, the electronic chip or the package.

In an embodiment, a thickness of the contact element is in a range between 10 µm and 1 mm, in particular in the range between 20 µm and 500 µm, more particularly in a range between 50 µm and 200 µm. For instance, the thickness of the contact element may be 100 µm. However, a length and a width of the contact element may be larger than its thickness. For instance, the length and the width of the contact element may be at least twice, in particular at least 5 times of its thickness. This provides a robust contact element.

In an embodiment, the electrically conductive contact element is a strip element (ribbon bond shaped element) comprising the first contact structure having a first layer made of the first electrically conductive material and the second contact structure having a second layer made of the second electrically conductive material. The strip element may be provided by cutting an endless tape consisting of the strip element material. Hence, the strip element may be a metallic tape/strip element, wherein one layer comprises in particular of a first layer of the first contact structure and a second layer of the second contact structure. The respective layers are on top of each other and form e.g. a layer structure. The strip element may be a flexible and in particular plastically deformable element. For example, the first layer of the strip element may be made of a first metal, such as aluminum, and the second layer of the strip element may be made of a second metal, such as copper. Hence, by the strip element, ribbon pieces for connection with the pad and the chip, respectively, and a further component or conductive structure is achieved. The strip element may be arranged onto the pad and may be electrically coupled to the pad by ribbon bond technologies, for example. Hence, an additional Cu plating procedure on the chip may not be necessary.

In an embodiment, the strip element comprises at least one third contact structure between the first contact structure and the second contact structure, wherein the at least one third contact structure in particular comprises or consists of a material having a higher thermal conductivity, a higher electric conductivity and/or a lower Young modulus than at least one of the first contact structure and the second contact structure.

In an embodiment, the strip element is bended such that the strip element comprises a curved profile, in particular one of a U-shape, V-shape, Z-shape and W-shape.

In an embodiment, the strip element comprises a first end, a second end and a center section arranged between the first end and the second end, wherein the first end and the second end are coupled to the pad and the center section is spaced apart from the pad.

Specifically, the curved profile of the strip elements may be formed by bending the strip element before arranging onto the respective pad. Specifically, a variety of robust profiles for the strip elements are available. For example, a strip element, which comprises a U- or V-profile may be bonded to the pad with its first end and second end, wherein the central part is spaced apart from the pad and extends specifically out of the encapsulation in order to provide a connection to external components, such as an electrically conductive connection structure, for example a redistribution layer. Alternatively, also a Z-shape profile of the strip element is bendable, such that the first end of the strip element is bonded to the pad and the second end of the strip element is spaced apart from the pad and connectable to further external components. In order to provide a plurality of bonding points, in particular more than two, onto the pad or to the external component, the strip element can be bended in the form of a W-shape, i.e. in a meander-like shape. Furthermore, the bended strip element may be embedded completely by an encapsulate, wherein only a part, in particular a part of the center section is not covered by the encapsulant.

In an embodiment, the method comprises attaching the contact element to the at least one pad before the encapsulating. By connecting the contact element to the chip pad already before encapsulating, the semiconductor chip is properly accessible and the procedure of handling the contact element is simple. For instance, the connection may be established by soldering, welding, etc.

In an embodiment, the method further comprises (before attaching the strip element forming the electrically conductive contact element to the at least one pad) a cutting of a strip element from an endless tape, e.g. a Bi-metallic tape or ribbon (e.g. made of aluminium and copper layers), comprising the first layer and the second layer.

In an embodiment, the method further comprises bending the strip element such that the profile of the strip element is curved, in particular a curved U-shape, curved V-shape, curved Z-shape and curved W-shape, before attaching the strip element to the at least one pad. Specifically, the respective strip elements may be bended before encapsulating the package. For example, the bended strip elements enclose open cavities. However, during encapsulation, the encapsulant flows inside the respective cavities for completely surrounding and thereby embedding the respective strip element. Hence, the risk of undesired air pockets in the package may be reduced since the step of encapsulating is conducted after the strip elements are mounted onto the respective pads.

In another embodiment, the method comprises attaching the contact element to the at least one pad after the encapsulating. Hence, it is alternatively also possible to firstly encapsulate the electronic chip by the encapsulant, and to then form an access hole extending through the encapsulant up to the chip pad. The contact element may then be inserted into such an access hole after encapsulation. Such an embodiment has the advantage that the second contact structure of the contact element does not have to be separately exposed after encapsulating.

In an embodiment, the method comprises exposing the contact element by removing excessive material of the encapsulant after the encapsulating. This can be done mechanically and/or chemically.

In an embodiment, the method comprises exposing the contact element by preventing encapsulation of an exposed portion of the contact element during the encapsulating. Additionally or alternatively to the removal of excessive encapsulant unintentionally covering the surface of the second contact structure of the contact element, it is possible to take a measure for preventing that an encapsulant material can be formed on the surface to be exposed. For example, this can be accomplished by covering the surface of the second contact structure which shall remain exposed after encapsulation by a surface portion of a molding tool. For instance, the electronic chip with already pre-mounted contact element may be inserted into a molding tool with the surface of the contact element which shall remain exposed contacting directly a portion of the molding tool. A subsequently inserted preform of a mold compound may then flow into the molding tool but will be prevented from flowing onto the surface of the contact element which shall remain exposed. Additionally or alternatively, it is possible to cover the surface of the contact element which shall remain uncovered by encapsulant with a protection foil during the encapsulation. When such a protection foil is attached (for instance adhered) on the surface of the contact element which shall remain exposed, removal of the foil after encapsulation will allow to obtain the contact element with an exposed surface.

Thus, the method may comprise exposing the second contact structure with respect to the encapsulant by at least one of the group consisting of:

covering at least a portion of the second contact structure during the encapsulating with a protection foil and removing the protection foil after the encapsulating;

contacting at least a portion of the second contact structure during the encapsulating with a surface of an encapsulation tool for preventing encapsulant to cover the contacted portion;

cleaning, in particular mechanically and/or chemically cleaning, at least a portion of the second contact structure after the encapsulation to thereby remove material of the encapsulant from the portion.

Other methods are of course possible.

In an embodiment, the method comprises refining an exposed surface of the second contact structure, in particular by forming a functional layer on the second contact structure. Thus, the exposed surface of the second contact structure may be made subject to a post-treatment so as to improve its properties desired for accomplishing a proper packaging. Refining its surface may comprise for instance adding a silver layer for improving solderability. It is also possible to apply a nickel-gold protection layer. Such a layer protects the contact element and promotes its capability of serving as an electrically conductive connection. Refining the exposed surface of the contact element may also comprise a cleaning procedure, for instance a mechanical polishing and/or a chemical deoxidizing procedure. Further alternatively, a thin aluminium oxide layer may be formed on the exposed second contact structure as a protection against oxidation of the contact element. For instance, a plating procedure can be carried out for forming additional material on the exposed surface of the second contact structure. This may be accomplished, for example, by a galvanic deposition procedure. More generally, such a refinement of the exposed surface may improve solderability, bondability, or plateability of the contact element. Also electroless plating is a possible option.

In an embodiment, the at least one electronic chip comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

In an embodiment, the encapsulant comprises a mold compound. Hence, the encapsulant may comprise a mold, in particular a plastic mold. For instance, a correspondingly encapsulated body (in particular chip with carrier) may be provided by placing the body or bodies between an upper mold tool and a lower mold tool and to inject liquid mold material therein. After solidification of the mold material, formation of the encapsulant is completed. If desired, the mold may be filled with particles improving its properties, for instance its heat removal properties.

In other exemplary embodiments, the encapsulant may also be a laminate or a casting component.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Descriptively speaking, the contact element may form a particularly stable pad extending out of the encapsulant.

The present invention provides also the following Aspects:

According to an aspect, a package is provided which comprises an electronic chip having at least one pad, an encapsulant at least partially encapsulating the electronic chip, and an electrically conductive contact element extending from the at least one pad and through the encapsulant so as to be exposed with respect to the encapsulant, wherein the electrically conductive contact element comprises a first contact structure made of a first electrically conductive material on the at least one pad and comprises a second contact structure made of a second electrically conductive material and being exposed with respect to the encapsulant.

According to an aspect, a package is provided which comprises an at least partially electrically conductive chip carrier, an electronic chip mounted on the chip carrier, wherein the electronic chip is provided with a pad having an exterior surface comprising a first metal, an electrically conductive contact element extending from the pad, and an encapsulant at least partially encapsulating the contact element and the electronic chip, wherein the contact element comprises a first contact structure on the at least one pad and comprising the first metal and comprises a second contact structure having an exposed surface being not covered by the encapsulant and comprising a second metal.

According to an aspect, a method of manufacturing a package is provided, wherein the method comprises at least partially encapsulating an electronic chip having at least one pad by an encapsulant, providing an electrically conductive contact element extending from the at least one pad and through the encapsulant so as to be exposed with respect to the encapsulant, and configuring the electrically conductive contact element to comprise a first contact structure made of a first electrically conductive material on the at least one pad and to comprise a second contact structure made of a second electrically conductive material and being exposed with respect to the encapsulant.

The above and other objects, features and advantages of the present invention will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the Figures, some general considerations will be summarized based on which exemplary embodiments have been developed.

According to an exemplary embodiment, a contact element in form of a bimetallic or multimetallic bond foot is provided as an interconnect for ultrathin packages. Such a package may be formed in a highly compact way and with low effort using existing chip technologies without the need of specifically adjusting a front side metallization. This may be accomplished by providing a simple bimetallic or multimetallic interconnect in form of the contact structure.

By directly contacting chips using laser drilling, vias and redistribution technology, chip embedding variants have been established which result in an increased electric and thermal performance. However, conventional approaches have the disadvantage that a via connection requires a chip technology with appropriate front side metallization of the chip, in particular a copper pad. Moreover, plating of copper vias may involve additional costs.

In order to overcome inter alia these shortcomings, an exemplary embodiment provides a (for instance aluminum-copper) multimetallic bond foot for chip connection in form of the above-mentioned contact element. By taking this measure, a thin package can be formed by encapsulation, in particular using a mold compound or a laminate. Subsequently, it may be possible to thin the encapsulant material until the copper side of the bond foot extends beyond the (for example mold type or laminate type) encapsulant. Subsequently, a further electrically conductive connection structure (such as a redistribution structure) may be formed to be electrically coupled with the exposed surface of the contact element. It is for instance possible to carry out copper plating on the encapsulant and on the exposed surface of the second contact structure. The latter may be made of a different metal than the first contact structure of the contact element being directly connected with the encapsulated semiconductor chip pad. Forming an electrically conductive connection structure such as a redistribution structure may also involve lamination of a copper clad with corresponding recess at the position where the contact element extends out of the encapsulant. Subsequently, a copper plating procedure may be carried out. The electrically conductive connection structure, like the redistribution structure, may be formed directly on the bond foot. In other words, the bond foot or contact element may serve as a package pad. Such a contact element may be formed by cutting or punching a portion of a bilayer sheet or ribbon, for instance having an aluminum layer integrally formed with a copper layer.

The mentioned embodiments have the advantage that also chip technologies may be implemented which have no suitable front side metallization for via connection. It is therefore dispensable to apply a copper plating process on a chip, which conventionally involves a significant effort.

According to an exemplary embodiment, a bimetal interconnection in form of a contact element may be provided for contacting, on one side thereof, a chip pad. An opposing other side thereof may be exposed with regard to an encapsulant and can be used for contacting the encapsulated electronic chip with an electronic environment of the package. In an embodiment, it is possible to carry out printed circuit board processes for further processing the package.

According to an exemplary embodiment, a bond foot may be used which is composed of different metallic materials, in particular is realized as a bimetallic bilayer structure. One of the metals corresponding to one of the layers may for instance be aluminum which can be connected using standard processes with an aluminum chip pad. The other metal and other layer may for instance be copper which may serve as a basis for further redistribution structures or as a pad, for instance to be connected to another copper structure (such as a copper pillar, a printed circuit board or a leadframe).

In an embodiment, the bond foot or contact element may be connected with the chip pad by ultrasonic bonding. It is possible to encapsulate the bonded chip with a laminate, a mold or a plastic.

Exposing the surface of the contact element may be carried out by cleaning procedures for refining or cleaning the exposed surface. It is therefore possible to use the exposed metallic surface of the contact element as a pad, in particular a wire bond pad. Such a pad-like exposed surface of the contact element may be also used for chip embedding processes. It is further possible to refine the pad-type exposed surface of the contact element for wire bonding. Moreover, it is possible to refine the pad-type exposed surface further on the contact element for providing a solder resist or for pre-soldering.

Further formation of redistribution structures by direct copper plating or lamination with a copper clad and copper plating may be carried out as well. It is then possible to manufacture molded and/or laminated packages based on the described principle.

In a nutshell, an exemplary embodiment may provide a semiconductor package having a semiconductor device such as a chip. An insulating material, as encapsulant, may cover at least one surface of the semiconductor chip. The semiconductor package may further comprise a contact element. The contact element may be arranged at the surface of the semiconductor chip. Additionally, the contact element may form a via in the insulating material. The contact element may have at least two different metallic layers.

FIG. 1 illustrates a cross-sectional view of a package 100 according to an exemplary embodiment.

The shown package 100 comprises an electronic chip 102, such as a semiconductor chip. In the shown embodiment, the electronic chip 102 is provided with a pad 104, for instance of aluminum, on an upper main surface of the electronic chip 102. An encapsulant 106, such as a mold compound, partially encapsulates the electronic chip 102 and an electrically conductive contact element 108. The electrically conductive contact element 108, which is here embodied as a bimetal double layer stack, extends from (and is connected to) the pad 104. The electrically conductive contact element 108 extends vertically through the encapsulant 106 in such a way that the contact element 108 is exposed with respect to the encapsulant 106. More specifically, the contact element 108 comprises a first contact structure 110 made of a first electrically conductive material, for instance aluminum, on the pad 104. The contact element 108 additionally comprises a second contact structure 112 made of a second electrically conductive material such as copper. As shown in FIG. 1, an upper surface of the second contact structure 112 is exposed with respect to the encapsulant 106 so that it is accessible from an exterior of the package 100.

The package 100 according to FIG. 1 has the advantage that the exposed surface 131 of the second contact structure 112 of the contact element 108 may serve as a pad of another material than the metal of the chip pad 104. Therefore, the exposed surface 131 may be directly connected, without undesired intermetallic bridge, with a further electronic member made of the second metal of which also the second contact structure 112 is made. At the same time, the metal of the chip pad 104 and the metal of the first contact structure 110 of the contact element 108 may be the same, so that an undesired intermetallic bridge is also dispensable in this region.

Figure 2:
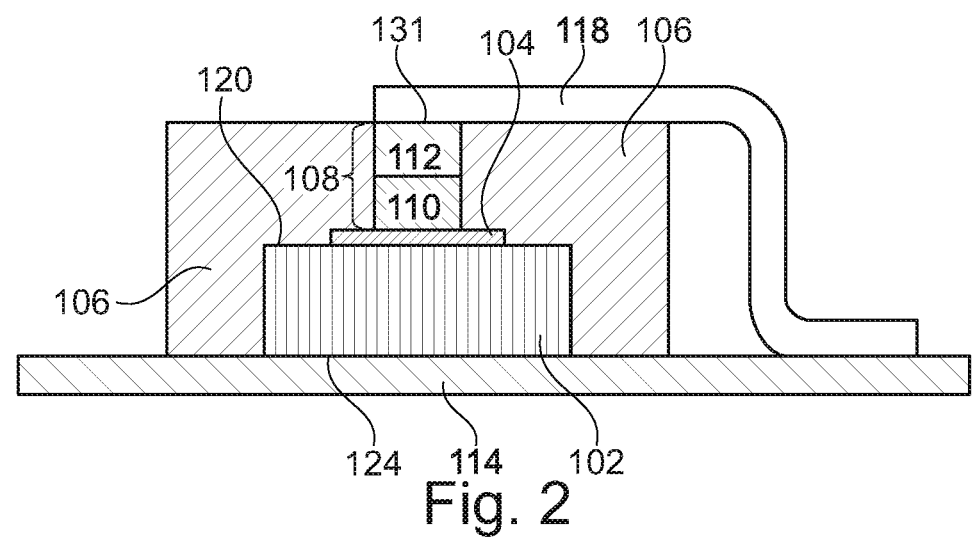
FIG. 2 illustrates a cross-sectional view of a package according to another exemplary embodiment.

FIG. 2 illustrates a cross-sectional view of a package 100 according to another exemplary embodiment.

The package 100 according to FIG. 2 comprises an electrically conductive chip carrier 114, such as a copper leadframe. An electronic chip 102, for example a power semiconductor chip, is mounted (for instance soldered) on the chip carrier 114. A bottom main surface 124 of the electronic chip 102 is attached to the chip carrier 114. The electronic chip 102 is provided with a pad 104 having an exterior surface comprising a first metal, for example aluminum. An electrically conductive contact element 108 extends upwardly from the pad 104 and is connected to the pad 104, for instance by soldering. An encapsulant 106, which may for instance be formed by casting, only partially encapsulates the contact element 108 and the electronic chip 102. As shown, the contact element 108 comprises a first metal layer (for instance an aluminum layer) forming a first contact structure 110 directly on the pad 104. Furthermore, the contact element 108 comprises a second metal layer (for instance a copper layer) forming a second contact structure 112. As shown, the second contact structure 112 has an exposed upper surface in alignment with an upper surface of the encapsulant 106. The exposed upper surface is not covered by the encapsulant 106. An electrically conductive contact structure 118, which is here embodied as a clip (for instance consisting of copper), provides a connection between the exposed surface 131 of the second contact structure 112 and the chip carrier 114.

As shown, the clip 118 (for instance made of copper) may be simply connected with the chip carrier 114 (in particular a leadframe made of copper as well) and with the exposed surface 131 of the second contact structure 112 which may be made of copper as well. In contrast to this, the chip pad 104 and the first contact structure 110 may be both made of aluminum. The material transition from aluminum to copper may therefore be established without undesired intermetallic bridges. This may be accomplished by the bimetallic character of the contact element or bond foot.

Figure 3:
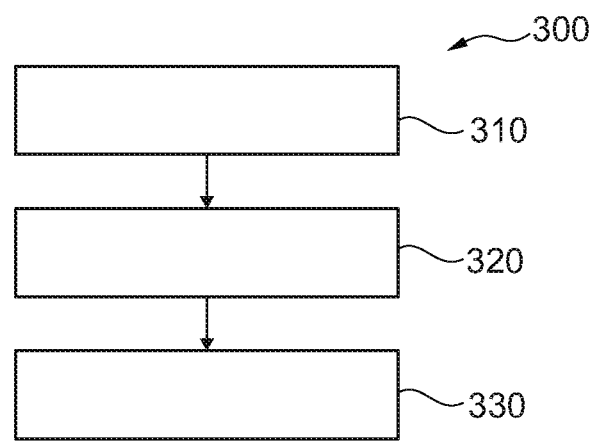
FIG. 3 illustrates a flowchart of a method of manufacturing a package according to an exemplary embodiment.

FIG. 3 illustrates a flowchart 300 of a method of manufacturing a package 100 according to an exemplary embodiment.

As indicated by a block 310, the method comprises at least partially encapsulating an electronic chip 102 having at least one pad 104 by an encapsulant 106. As illustrated by a block 320, the method may further comprise providing an electrically conductive contact element 108 extending from the at least one pad 104 and through the encapsulant 106 so as to be exposed with respect to the encapsulant 106. Furthermore, a block 330 indicates that the method may additionally comprise configuring the contact element 108 to comprise a first contact structure 110 made of a first electrically conductive material on the at least one pad 104 and to comprise a second contact structure 112 made of a second electrically conductive material and being exposed with respect to the encapsulant 106.

Of course, further procedures can be added to the method described referring to FIG. 3.

Figure 4:
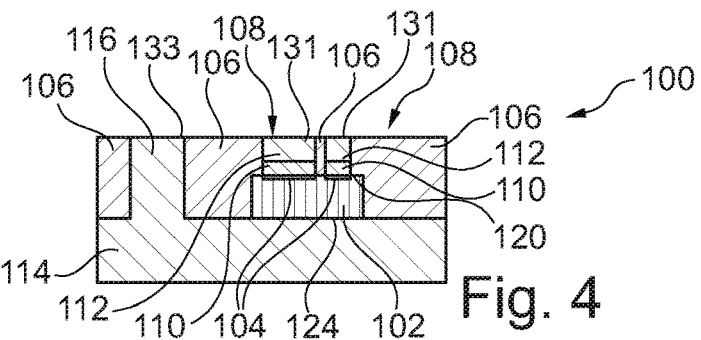
FIG. 4 illustrates a cross-sectional view of a package according to still another exemplary embodiment.

FIG. 4 illustrates a cross-sectional view of a package 100 according to still another exemplary embodiment.

The package 100 of FIG. 4 comprises an electrically conductive chip carrier 114 (such as a leadframe which may be formed of copper) on which an electronic chip 102 is mounted. Furthermore, the package 100 shown in FIG. 4 comprises an electrically conductive protrusion 116 (for instance a copper block) protruding from the chip carrier 114 up to a vertical level up to which a contact element 108, as described referring to FIG. 1 or FIG. 2, extends. The protrusion 116 extends through the encapsulant 106 and is exposed at an upper side with respect to the encapsulant 106. The encapsulant 106 may be formed from a dielectric mold compound. The contact element 108 is formed as a double layer bimetal structure, i.e. as a plate-shaped aluminum-copper bimetal double layer structure. For instance, a vertical thickness of the contact element 108 is in a range between 50 μm and 200 μm. The length and the width of the contact element 108 in a horizontal plane may be larger than the vertical thickness.

In the embodiment of FIG. 4, two chip pads 104 on an upper main surface of the electronic chip 102 are provided which are directly connected (for instance by soldering or welding) to the first contact structure 110 of the contact element 108. For instance, the chip pads 104 and the first contact structures 110 may be both made of aluminum. The exposed second contact structures 112 of the two contact elements 108 are however exposed with regard to the encapsulant 106 but are aligned at their top surface with the top surface of the encapsulant 106. Therefore, the second contact structures 112 may serve as pad-like structures made of copper allowing to indirectly contact the encapsulated electronic chip 102 with aluminum pads 104. Also the exposed upper surface 133 of the electrically conductive protrusion 116 is at the same vertical level as the upper main surfaces of the contact elements 108 and of the encapsulant 106. Therefore, a planar surface is formed which allows a planar connection between the electrically conductive structures 116, 112. This will be described below in more detail referring to FIG. 5. The chip carrier 114 (for instance a copper leadframe) as well as the protrusions 116 (for instance copper blocks) may be made of the same material (i.e. copper) as the second contact structures 112 of the contact elements 108 and may therefore be connected without forming undesired intermetallic bridges.

Figure 5:
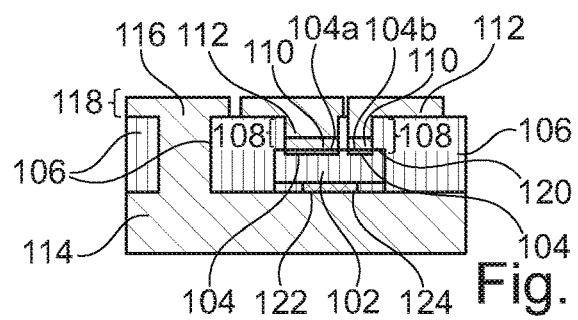
FIG. 5 illustrates a cross-sectional view of a package according to yet another exemplary embodiment.

FIG. 5 illustrates a cross-sectional view of a package 100 according to yet another exemplary embodiment. Differences with regard to the embodiment of FIG. 4 will be described in the following.

According to FIG. 5, the chip carrier 114 is connected with a further pad 122 of the electronic chip 102 on a bottom main surface 124 thereof. In the shown embodiment, two pads 104 (denoted with reference numerals 104a, 104b) are formed on the upper main surface 120 of the electronic chip 102 and the one further pad 122 is formed on the opposing bottom main surface 124 of the electronic chip 102. The package 100 of FIG. 5 additionally comprises a planar electrically conductive connection structure 118 on an exposed surface portion of the contact elements 108, an exposed surface portion of the protrusion 116, and an upper main surface of the encapsulant 106. In the shown embodiment, the electrically conductive connection structure 118 is configured as a redistribution layer on the encapsulant 106, on the protrusion 116 and on the contact elements 108.

Since the electronic chip 102 of the package 100 according to FIG. 5 is a transistor chip, it has a source pad 104a, a drain pad 122 and a gate pad 104b. The source pad 104a and the gate pad 104b are formed on the same upper main surface 120 of the electronic chip 102 and are each coupled with a first contact structure 110 of a respective one of the contact elements 108. In contrast to this, the drain pad 122 is formed on the opposing lower main surface 124 of the electronic chip 102 in direct electrically conductive connection with the chip carrier 114.

As shown in the embodiment of FIG. 5, the embodiment of FIG. 4 can be further developed by also providing a further pad 122 on the lower main surface of the electronic chip 102. This further pad 122 may be electrically connected with one of the chip pads 104a, 104b on the upper main surface of the semiconductor chip 102 via the electrically conductive chip carrier 114, the electrically conductive protrusion 116 and redistribution layer 118 (the latter formed by patterning one or more copper layers on the top main surface of the package 100 shown in FIG. 4). Descriptively speaking, the redistribution-type electrically conductive connection structure 118 may translate between the small dimensions of the chip world and the larger dimensions of the world of mounting bases (such as a printed circuit board) to which the upper main surface of the package 100 of FIG. 5 may be connected (not shown).

As in the embodiment of FIG. 4, no undesired intermetallic bridges are formed apart from the interior of the contact elements 108 which may be stacked layers of copper and aluminum. Such stacked layers can however be provided as pre-formed an integral multi-layer structure with low effort.

The embodiment of FIG. 5 thus corresponds to a package 100 with encapsulated transistor chip 102 having on its lower main surface 124 the further pad 122 as drain pad, and having on its upper main surface 120 the gate pad 104b and the source pad 104a.

FIG. 6 to FIG. 11 illustrate cross-sectional views of structures obtained during manufacturing a package 100, shown in FIG. 4 or FIG. 5, according to an exemplary embodiment.

Figure 6:
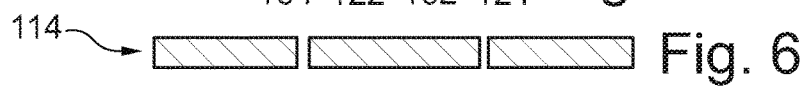
FIG. 6 to FIG. 11 illustrate cross-sectional views of structures obtained during manufacturing a package, shown in FIG. 4 or FIG. 5, according to an exemplary embodiment.

The chip carrier 114 used as a starting point and shown in FIG. 6 is a structured leadframe.

Figure 7:
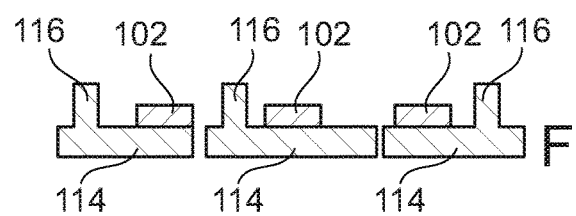

Referring to FIG. 7, the method comprises mounting electronic chips 102 on the chip carrier 114 and attaching electrically conductive protrusions 116 to the chip carrier 114. The structure shown in FIG. 7 can be obtained by attaching the naked dies, i.e. the bare semiconductor chips 102 on mounting areas of the structured leadframe shown as an example for a chip carrier 114 in FIG. 6.

Furthermore, copper blocks may be attached as vertical electrically conductive protrusions 116 on the mounting surface of the chip carrier 114 and extending vertically beyond the upper main surfaces of the electronic chips 102.

Alternatively, it is also possible that the electrically conductive protrusions 116 are integrally formed with the chip carrier 114, i.e. without attaching the protrusions 116 onto the carrier 114. For instance, material of an original preform of the chip carrier 114 may be etched away so that regions between the protrusions 116 are selectively removed and the protrusions 116 remain integrally connected with a plate-shaped portion of the chip carrier 114.

In yet another exemplary embodiment, it is also possible that the electrically conductive protrusions 116 are formed after the encapsulation procedure described below referring to FIG. 9. In such an embodiment, recesses may be etched in an encapsulant 106. Subsequently, material forming the protrusions 116 may be inserted into the recesses. For example, a solder ball may be inserted into such a recess, may be melted and thereafter solidified and may thereby be converted into a protrusion 116.

Figure 8:
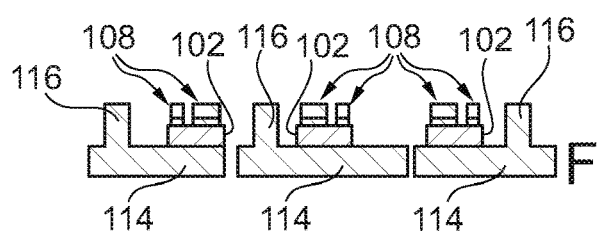

Referring to FIG. 8, electrically conductive contact elements 108 are provided each extending from a respective one of the pads 104. The contact elements 108 are each provided with a first contact structure 110 made of a first electrically conductive material and connected on the pad 104 and is provided with a second contact structure 112 made of a second electrically conductive material and having an upper free end. As shown, the contact elements 108 are attached to and connected with the pads 104.

Thus, in order to obtain the structure shown in FIG. 8, aluminum-copper bond foots may be attached as contact elements 108 to the chip pads 104 on the upper main surface of the electronic chips 102. The upper main surfaces of the contact elements 108 may be vertically aligned with the upper main surfaces of the electrically conductive protrusions 116.

Figure 9:
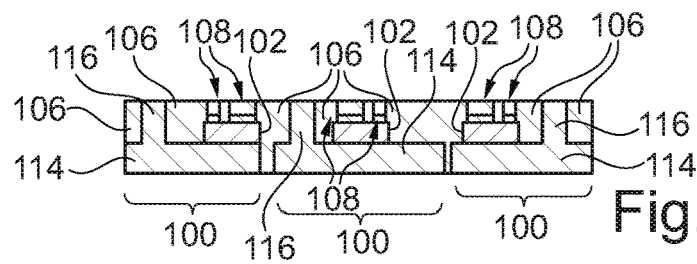

Referring to FIG. 9, the carrier 114, the electronic chips 102, the protrusions 116 and the chip carrier 114 are partially encapsulated by a mold type encapsulant 106. The contact elements 108 extend through the encapsulant 106 but are exposed at a flat planar horizontal top surface of the second contact structures 112 with respect to the encapsulant 106. Also flat planar horizontal top surfaces of the protrusions 116 are exposed with respect to the encapsulant 106.

If desired or required, the contact elements 108 may be treated by removing excessive material of the encapsulant 106 from their top surfaces after the encapsulating. For instance, it is possible to mechanically and/or chemically clean the second contact structure 112 after the encapsulation to thereby remove material of the encapsulant 106 from the top portion of the second contact structures 112.

It is however also possible to ensure that the contact elements 108 are exposed by preventing encapsulation of top portions of the contact elements 108 during the encapsulating procedure. For instance, exposing the second contact structures 112 with respect to the encapsulant 106 may be ensured by covering top portions of the second contact structure 112 during the encapsulating with a protection foil (not shown) and removing the protection foil after the encapsulating. Additionally or alternatively, the top portions of the second contact structure 112 may be contacted during the encapsulating procedure with a surface of an encapsulation tool (not shown) for preventing material of the encapsulant 106 to cover the contacted portion.

The structure shown in FIG. 9 may thus be obtained by encapsulating the structure shown in FIG. 8, in particular by molding. During this encapsulation procedure, the upper main surfaces of the contact elements 108 as well as the upper main surfaces of the protrusions 116 may be prevented from being encapsulated and/or may be exposed from encapsulant 106 after encapsulation. This can be accomplished for example by a mechanical treatment (water-jet, polishing) and/or chemically (for instance by etching away excessive encapsulant material).

Figure 10:
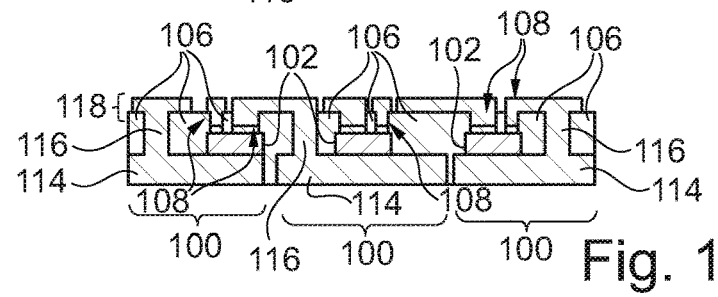

The structure shown in FIG. 10 can be obtained by forming a redistribution layer, as an example for an electrically conductive connection structure 118, on the planar upper main surface of the structure shown in FIG. 9. This may involve attaching and patterning copper foils, depositing copper or other electrically conductive material by plating, carrying out patterning procedures (such as lithographic patterning), etc. It is also possible that the electrically conductive connection structure 118 comprises electrically insulating layers (not shown) in which the electrically conductive elements of the electrically conductive connection structure 118 may be embedded.

Figure 11:
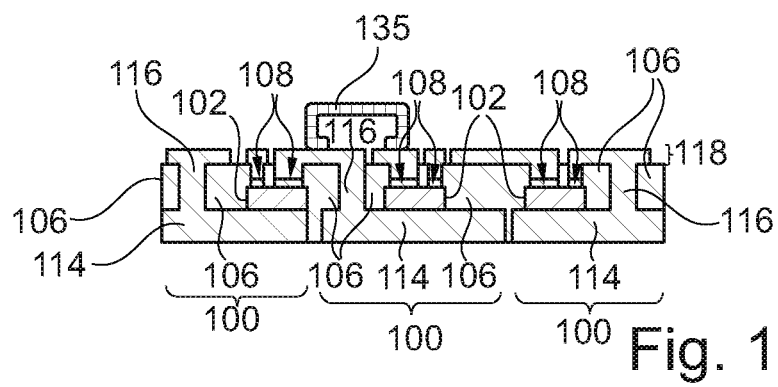

As shown in FIG. 11, it is optionally possible to attach a further member 135 on the upper main surface of the structure shown in FIG. 10, for instance a passive component such as a ceramic capacitor or an ohmic resistor.

As shown in FIG. 11, multiple packages 100 can be formed on batch level as described referring to FIG. 6 to FIG. 11. After such a common manufacturing process of manufacturing multiple packages 100 simultaneously, the structure shown in FIG. 11 may be singularized so as to obtain multiple packages 100 shown in FIG. 4 or FIG. 5.

Figure 12:
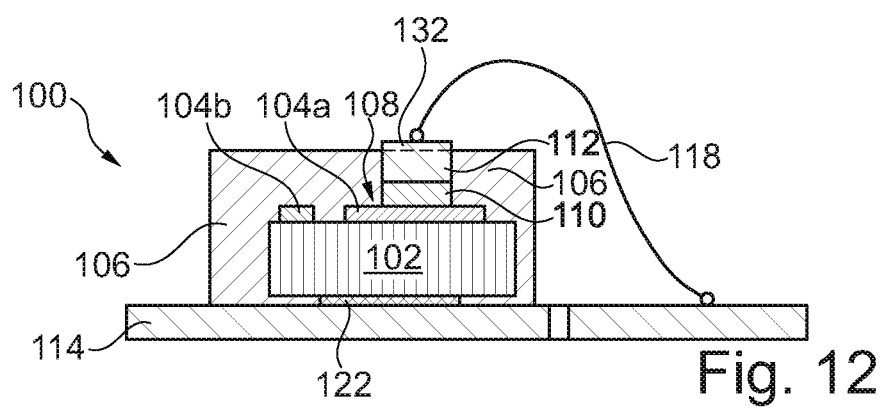
FIG. 12 illustrates a cross-sectional view of a package according to still another exemplary embodiment.

FIG. 12 illustrates a cross-sectional view of a package according to still another exemplary embodiment.

The embodiment of FIG. 12 shows a package 100 in which an electronic chip 102 with pads 104a, 104b, 122 on both opposing main surfaces is encapsulated in an encapsulant 106, together with a contact element 108 as described above. The second contact structure 112 of the contact element 108 is exposed with regard to the encapsulant 106 and extends up to the same vertical level as the encapsulant 106. Thereafter, a refinement procedure for refining the exposed surface of the contact element 108 may be carried out. The manufacturing method corresponding to the package 100 of FIG. 12 may thus comprise refining an exposed surface of the second contact structure 112, for instance by forming a functional layer 132 on the second contact structure 112.

Furthermore, it is possible to connect a wire bond as another example for an electrically conductive connection structure 118 between the functional layer 132 and an electrically conductive surface of the chip carrier 114, for instance a copper surface thereof. Thus, it is possible to use a copper wire bond for connecting the copper leadframe as chip carrier 114 with the exposed copper surface of the second contact structure 112, although the chip pads 104a, 104b on the top side of the semiconductor chip 102 may be made of another material, such as aluminum. This aluminum material may be connected to the first contact structure 110, which may be made of aluminum as well.

Figure 13:
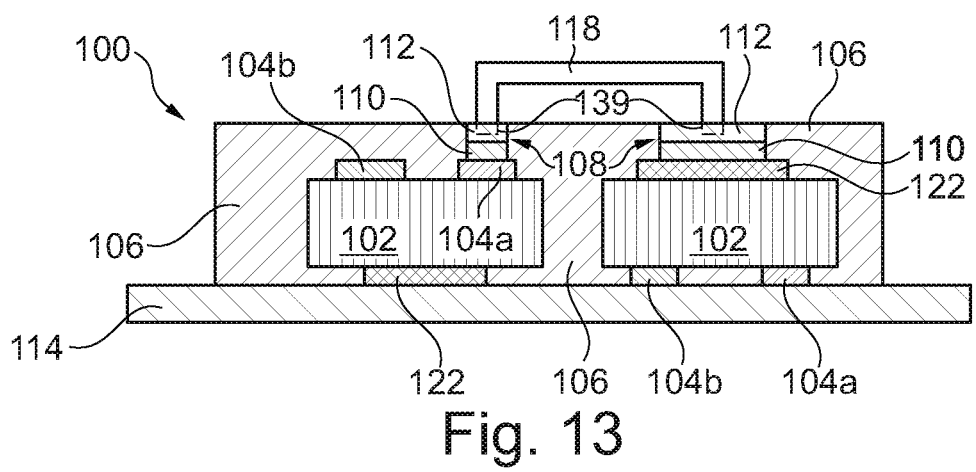
FIG. 13 illustrates a cross-sectional view of a package according to yet another exemplary embodiment.

FIG. 13 illustrates a cross-sectional view of a package 100 according to yet another exemplary embodiment in which two semiconductor chips 102 are connected in a half-bridge configuration and are embedded in the same encapsulant 106. Two contact elements 108 may be used for connecting upper pads 104a, 122 of the two semiconductor chips 102 via a clip as further example of an electrically conductive connection structure 118. In the shown example, the clip may extend into recesses 139 formed in the respective second contact structures 112 of the contact elements 108 attached to the two electronic chips 102. Again, it is possible to use for instance a copper clip although the contacted pads 104a, 122 of the shown semiconductor chips 102 may be made of aluminum.

Figure 14:
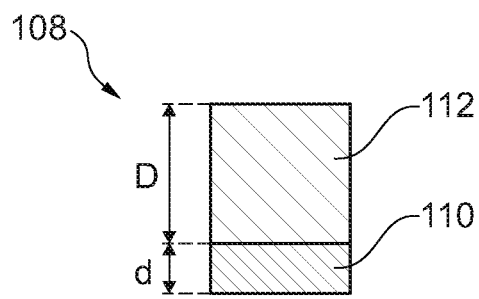
FIG. 14 illustrates a cross-sectional view of a contact element of a package according to an exemplary embodiment.

FIG. 14 illustrates a cross-sectional view of a contact element 108 of a package 100 according to an exemplary embodiment. The embodiment of FIG. 14 shows a bimetallic bilayer contact element 108 according to an exemplary embodiment.

In the contact element 108 of FIG. 14, a thickness d of the first contact structure 110 is smaller than a thickness D of the second contact structure 112. As shown, the thickness d of the layer-type first contact structure 110 may be thinner than the thickness D of the layer-type second contact structure 112. For instance, a thin aluminum layer with thickness d and forming the first contact structure 110 may thus be integrally connected with a thicker (thickness D>d) copper layer forming the second contact structure 112. By taking this measure, the lower costs, better processibility and high thermal conductivity of copper may be combined with a thin aluminium layer for serving as a connection to an aluminum pad of a semiconductor chip without formation of intermetallic bridges.

Figure 15:
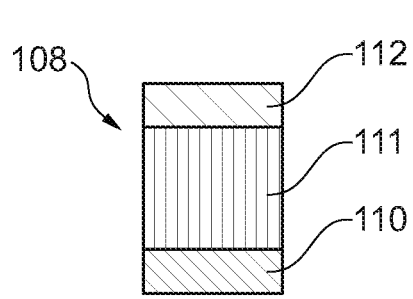
FIG. 15 illustrates a cross-sectional view of a contact element of a package according to another exemplary embodiment.

FIG. 15 illustrates a cross-sectional view of a contact element 108 of a package 100 according to another exemplary embodiment.

In this embodiment, the contact element 108 comprises a third contact structure 111 as an additional layer sandwiched between the layer-type first contact structure 110 and the layer-type second contact structure 112. Thus, the embodiment of FIG. 15 is composed of three interconnected layers (see reference numerals 110, 111, 112). The lowermost layer forms the first contact structure 110, the uppermost layer forms the second contact structure 112, and the third contact structure 111 is sandwiched as a third layer in between. For instance, the first contact structure 110 may be made of aluminum, the second contact structure 112 may be made of copper, and the third contact structure 111 may be made of still another metallic material, which may be selected by a circuit designer based on the requirements of a certain application.

Figure 16:
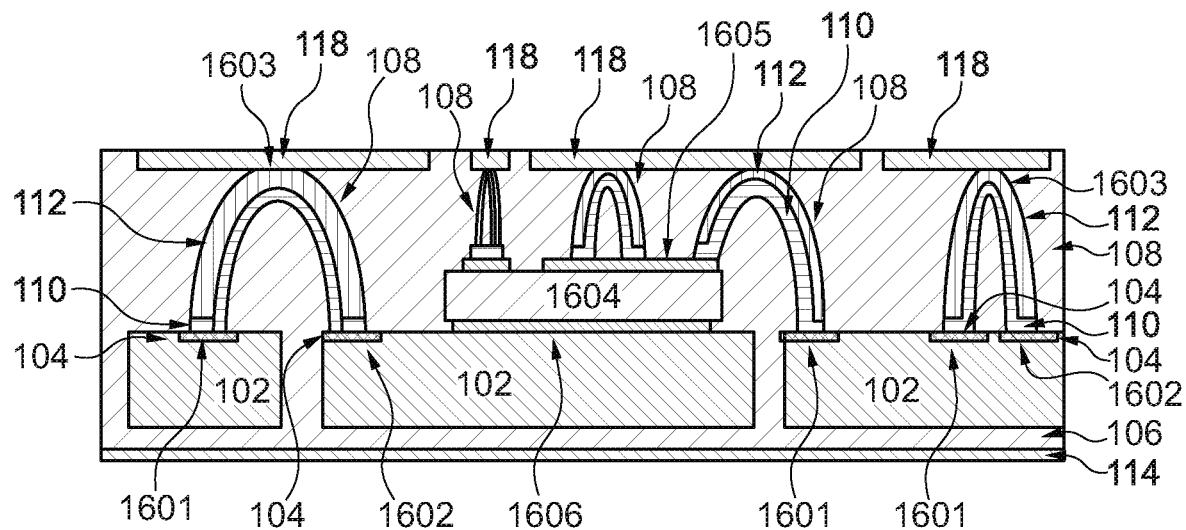
FIG. 16 illustrates a cross-sectional view of a package according to yet another exemplary embodiment.

FIG. 16 illustrates a cross-sectional view of a package 100 according to yet another exemplary embodiment.

The shown package 100 comprises electronic chips 102, such as semiconductor chips. The electronic chips 102 are provided with pads 104, for instance of aluminum, on upper main surfaces of the electronic chips 102. An encapsulant 106, such as a mold compound, partially encapsulates the electronic chip 102 and an electrically conductive contact element 108. The electrically conductive contact element 108 is in the shown embodiment a strip element (ribbon bond shaped element) comprising the first contact structure 110 having a first layer made of the first electrically conductive material and the second contact structure 112 having a second layer made of the second electrically conductive material.

For example, the first layer of the strip element may be made of a first metal, such as aluminum, and the second layer of the strip element may be made of a second metal, such as copper. Hence, by the strip element, ribbon pieces for connection with the pad and the chip, respectively, and a further component or conductive structure is achieved. The strip element is electrically coupled with the pad 104 and is electrically coupled to the pad 104 e.g. by ribbon bond technologies, for example.

The strip elements comprise a first end 1601, a second end 1602 and a center section 1603 arranged between the first end 1601 and the second end 1602. In the exemplary embodiment shown in FIG. 16, the first end 1601 and the second end 1602 are electrically coupled to the respective pad 104 and the center section 1603 is spaced apart from the respective pad 104. In the exemplary embodiment shown in FIG. 16, the strip elements have a U-shape. The outer layer forms the second contact structure 112 which is connected in the region of the center section 1603 to another component, such as the electrically conductive connection structure 118, for example a redistribution structure or a lead frame. An inner layer of the strip element forms the first contact structure 110 which is connected with its ends 1601, 1602 to a respective pad 104. Along the pad 104, the first end 1601 and the second end 1602 are spaced apart from each other. At the respective ends 1601, 1602 the material of the first contact structure 110 partially encloses and covers the respective end faces of the second contact structure 112, such that material of the first contact structure 110 contact and can be bonded to the respective pads 104 of the semiconductor chip 102. Hence, the strip elements extend vertically through the encapsulant 106 in such a way that the strip elements are exposed with respect to the encapsulant 106. More specifically, the strip elements comprise layers of the first contact structure 110 made of a first electrically conductive material, for instance aluminum, on the pad 104. The strip elements additionally comprise a layer of second contact structure 112 made of a second electrically conductive material such as copper.

Furthermore, in the exemplary embodiment of FIG. 16, a further electronic chip 1604 is shown comprising a frontside metallization 1605 and a backside metallization 1606. The backside metallization 1606 may be electrically connected directly to the electronic chip 102. Respective electrically conductive elements 108 are connected to the frontside metallization 1605 such that the frontside metallization 1605 may function as a respective pad 104 according to the claimed solution. The electrically conductive contact elements 108 couple the frontside metallization 1605 to the electrically conductive connection structure 118 may also be U-shaped and comprising respective first contact structures 110 having a first layer made of the first electrically conductive material and second contact structures 112 having a second layer made of the second electrically conductive material. The chip 1603 may be an IGBT (Insulated Gate Bipolar Transistor), a MOSFET (metal-oxide-semiconductor field-effect transistor), a diode or an integrated circuit IC.

Figure 17:
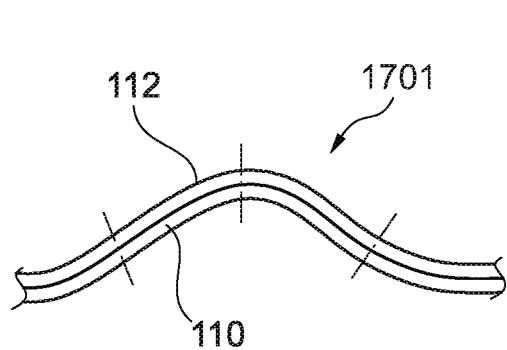
FIG. 17 illustrates a schematic view of an endless tape for forming strip elements according to an exemplary embodiment.

FIG. 17 illustrates a schematic view of an endless tape 1701 for forming strip elements according to an exemplary embodiment.

The strip elements are provided by cutting the endless tape 1701 consisting of the strip element material. Hence, the strip element may be a metallic tape/strip element, wherein one layer comprises in particular of a first layer of the first contact structure and a second layer of the second contact structure. The strip element may be a flexible and in particular plastically deformable element.

Figure 18:
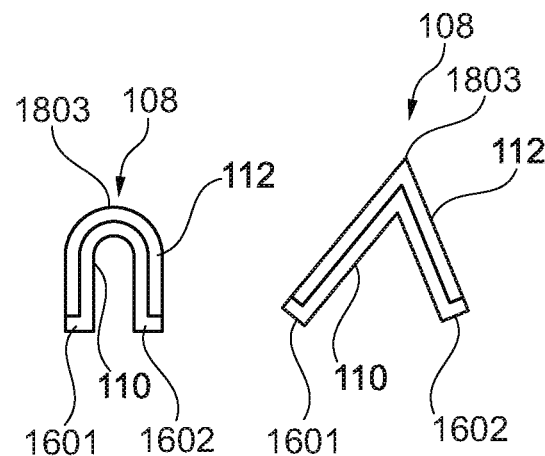
FIG. 18 illustrates a schematic views of bended strip elements according to an exemplary embodiment.

FIG. 18 illustrates a schematic views of bended strip elements according to an exemplary embodiment. The strip elements as shown in FIG. 18 are bended such that the strip element form a curved profile, in particular a U-shape or a V-shape. Specifically, the curved profile of the strip elements may be formed by bending the strip element before arranging onto the respective pad. Specifically, a variety of robust profiles for the strip elements are available. For example, a strip element, which comprises a U- or V-profile, may be bonded to the pad 104 with its first end 1601 and second end 1602, wherein the central part 1603 is spaced apart from the pad 104 and extends specifically out of the encapsulation in order to provide a connection to external components, such as a component carrier.

As can be taken from FIG. 18, the ends 1601, 1602 are folded in such a way that the material of the first contact structure 110 partially encloses and covers the respective end faces of the second contact structure 112, such that material of the first contact structure 110 contact and can be bonded to the respective pads 104 of the semiconductor chip 102.

Furthermore, the bended strip element may be embedded completely by an encapsulate 106. After being bonded to the pad 104, an inner cavity of the strip elements enclosed by the end sections 1601, 1602 and the central section 1603 are formed. However, during encapsulation, the encapsulant 106 flows inside the respective cavities for surrounding and thereby embedding the respective strip elements. Hence, the risk of undesired air pockets in the package may be reduced since the step of encapsulating is conducted after the strip elements are mounted onto the respective pads.

It should be mentioned that, although in the above embodiments, copper and aluminum have been mentioned as examples, any other combination of metals or alloys may be used for composing the contact element 108. This may depend on the particularities of a certain application.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
   an electronic chip having at least one pad;
   an encapsulant at least partially encapsulating the electronic chip;
   an electrically conductive contact element extending from the at least one pad and through the encapsulant so as to be exposed with respect to the encapsulant;
   wherein the electrically conductive contact element comprises a first contact structure made of a first electrically conductive material on the at least one pad and comprises a second contact structure made of a second electrically conductive material and being exposed with respect to the encapsulant, wherein the first contact structure is disposed entirely within the encapsulant and the second contact structure is disposed at least partially within the encapsulant; and
   wherein at least one of the at least one pad has at least a surface portion which comprises or is made of the first electrically conductive material.

2. The package according to claim 1, comprising a chip carrier on which the electronic chip is mounted.

3. The package according to claim 2, wherein the chip carrier has at least a surface portion which comprises or is made of a third electrically conductive material, wherein the third electrically conductive material in particular comprises or is made of the second electrically conductive material.

4. The package according to claim 2, wherein the chip carrier is connected with at least one further pad of the electronic chip, wherein the at least one pad is formed on a main surface of the electronic chip and the at least one further pad is formed on an opposing other main surface of the electronic chip.

5. The package according to claim 1, wherein the electrically conductive contact element is a layer stack comprising, as the first contact structure, at least a first layer made of the first electrically conductive material and, as the second contact structure, at least a second layer made of the second electrically conductive material.

6. The package according to claim 1, comprising an electrically conductive connection structure on a surface portion of the second contact structure, the surface portion being exposed with respect to the encapsulant.

7. The package according to claim 6, wherein the electrically conductive connection structure comprises at least one of the group consisting of a redistribution structure, in particular a redistribution layer at least partially on the encapsulant and on the contact element, a clip, a wire bond, and a ribbon bond.

8. The package according to claim 1,
   wherein the electrically conductive contact element is a strip element comprising the first contact structure having a first layer made of the first electrically conductive material and the second contact structure having a second layer made of the second electrically conductive material.

9. The package according to claim 8,
   wherein the strip element comprises at least one third contact structure between the first contact structure and the second contact structure, wherein the at least one third contact structure in particular comprises or consists of a material having a higher thermal conductivity, a higher electric conductivity and/or a lower Young modulus than at least one of the first contact structure and the second contact structure.

10. The package according to claim 9,
    wherein the strip element is bended such that the strip element comprises a curved profile, in particular one of an U-shape, V-shape, Z-shape and W-shape.

11. The package according to claim 10,
    wherein the strip element comprises a first end, a second end and a center section arranged between the first end and the second end,
    wherein the first end and the second end are coupled to the pad and the center section is spaced apart from the pad.

12. A package, comprising:
    an electronic chip having at least one pad;
    an encapsulant at least partially encapsulating the electronic chip;
    an electrically conductive contact element extending from the at least one pad and through the encapsulant so as to be exposed with respect to the encapsulant;
    wherein the electrically conductive contact element comprises a first contact structure made of a first electrically conductive material on the at least one pad and comprises a second contact structure made of a second electrically conductive material and being exposed with respect to the encapsulant;
    wherein at least one of the at least one pad has at least a surface portion which comprises or is made of the first electrically conductive material;
    comprising a chip carrier on which the electronic chip is mounted; and
    comprising at least one electrically conductive protrusion protruding from the chip carrier, in particular up to a vertical level up to which the contact element extends.

13. The package according to claim 12, wherein the at least one electrically conductive protrusion comprises or is made of a fourth electrically conductive material, wherein the fourth electrically conductive material in particular comprises or is made of one of the second electrically conductive material and the third electrically conductive material.

14. A package, comprising:
    an at least partially electrically conductive chip carrier;

an electronic chip mounted on the chip carrier, wherein the electronic chip is provided with a pad having an exterior surface comprising a first metal;

an electrically conductive contact element extending from the pad;

an encapsulant at least partially encapsulating the contact element and the electronic chip; and wherein the contact element comprises:
- a first contact structure on the at least one pad and being disposed entirely below an upper surface of the encapsulant; and
- a second contact structure being disposed at least partially below the upper surface of the encapsulant and comprising an exposed surface being not covered by the encapsulant,
- the first contact structure comprising the first metal and the second contact structure comprising a second metal.

15. The package according to claim 14, wherein a thickness (d) of the first contact structure is different from a thickness (D) of the second contact structure.

16. The package according to claim 14, wherein the electrically conductive contact element comprises at least one third contact structure between the first contact structure and the second contact structure, wherein the at least one third contact structure in particular comprises or consists of a material having a higher thermal conductivity, a higher electric conductivity and/or a lower Young modulus than at least one of the first contact structure and the second contact structure.

17. The package according to claim 14, wherein the electrically conductive contact element is plate-shaped or strip-shaped.

18. A method of manufacturing a package, wherein the method comprises:
- at least partially encapsulating an electronic chip, having at least one pad, by an encapsulant;
- providing an electrically conductive contact element extending from the at least one pad and through the encapsulant so as to be exposed with respect to the encapsulant;
- configuring the electrically conductive contact element to comprise a first contact structure made of a first electrically conductive material on the at least one pad, the first contact structure disposed entirely below an upper surface of the encapsulant, and to comprise a second contact structure made of a second electrically conductive material, the second contact structure disposed at least partial below the upper surface of the encapsulant and being exposed with respect to the encapsulant,
- wherein at least one of the at least one pad has at least a surface portion which comprises or is made of the first electrically conductive material.

19. The method according to claim 18, wherein the method comprises attaching the electrically conductive contact element to the at least one pad before the encapsulating.

20. The method according to claim 19, comprising one of the following features:
- wherein the method comprises exposing the electrically conductive contact element by removing excessive material of the encapsulant after the encapsulating;
- wherein the method comprises exposing the contact element by preventing encapsulation of an exposed portion of the contact element during the encapsulating.

21. The method according to claim 18, wherein the method comprises mounting the electronic chip on a chip carrier, and optionally providing an electrically conductive protrusion on the chip carrier, in particular before encapsulating at least partially the protrusion and the electronic chip.

22. The method according to claim 18, wherein the method comprises exposing the second contact structure with respect to the encapsulant by at least one of the group consisting of:
- covering at least a portion of the second contact structure during the encapsulating with a protection foil and removing the protection foil after the encapsulating;
- during the encapsulating, establishing a contact of at least a portion of the second contact structure with a surface of an encapsulation tool for preventing encapsulant to cover the contacted portion;
- cleaning, in particular mechanically and/or chemically cleaning, at least a portion of the second contact structure after the encapsulation to thereby remove material of the encapsulant from the portion.

23. The method according to claim 18, wherein the method comprises refining an exposed surface of the second contact structure, in particular by cleaning, by activating and/or by forming a functional layer on the second contact structure.

24. A method of manufacturing a package, wherein the method comprises:
- at least partially encapsulating an electronic chip, having at least one pad, by an encapsulant;
- providing an electrically conductive contact element extending from the at least one pad and through the encapsulant so as to be exposed with respect to the encapsulant;
- configuring the electrically conductive contact element to comprise a first contact structure made of a first electrically conductive material on the at least one pad and to comprise a second contact structure made of a second electrically conductive material, and being exposed with respect to the encapsulant,
- wherein at least one of the at least one pad has at least a surface portion which comprises or is made of the first electrically conductive material;
- wherein the method comprises attaching the electrically conductive contact element to the at least one pad before the encapsulating; and
- wherein the electrically conductive contact element is a strip element comprising the first contact structure having a first layer made of the first electrically conductive material and the second contact structure having a second layer made of the second electrically conductive material.

25. The method according to claim 24, further comprising before attaching the strip element to the at least one pad
cutting of the strip element from an endless tape comprising the first layer and the second layer.

26. The method according to claim 24, further comprising bending the strip element such that the profile of the strip element is curved, in particular a curved U-shape, curved V-shape, curved Z-shape and curved W-shape, before attaching the strip element to the at least one pad.

* * * * *

UNITED STATES PATENT AND TRADEMARK OFFICE
CERTIFICATE OF CORRECTION

PATENT NO. : 11,056,458 B2
APPLICATION NO. : 16/690948
DATED : July 6, 2021
INVENTOR(S) : Kessler et al.

Page 1 of 1

It is certified that error appears in the above-identified patent and that said Letters Patent is hereby corrected as shown below:

On the Title Page

Item [56], delete "DE 1 2004 000 727" and insert in place thereof --DE 11 2004 000 727--.

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*